United States Patent
Crook et al.

(10) Patent No.: US 9,698,192 B1
(45) Date of Patent: Jul. 4, 2017

(54) TWO-COLOR BARRIER PHOTODETECTOR WITH DILUTE-NITRIDE ACTIVE REGION

(71) Applicant: LOCKHEED MARTIN CORPORATION, Bethesda, MD (US)

(72) Inventors: Adam M. Crook, Goleta, CA (US); Matthew J. Reason, Goleta, CA (US); Barrett Spells, Santa Barbara, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/825,597

(22) Filed: Aug. 13, 2015

Related U.S. Application Data

(60) Provisional application No. 62/036,751, filed on Aug. 13, 2014, provisional application No. 62/036,759, filed on Aug. 13, 2014.

(51) Int. Cl.
*H01L 27/146* (2006.01)
*H01L 31/18* (2006.01)
*H01L 31/0304* (2006.01)
*H01L 31/109* (2006.01)

(52) U.S. Cl.
CPC .. *H01L 27/14652* (2013.01); *H01L 27/14683* (2013.01); *H01L 31/03044* (2013.01); *H01L 31/03046* (2013.01); *H01L 31/109* (2013.01); *H01L 31/1844* (2013.01); *H01L 31/1856* (2013.01)

(58) Field of Classification Search
CPC ......... H01L 27/14652; H01L 27/14683; H01L 31/1844; H01L 31/03044; H01L 31/109; H01L 31/1856; H01L 31/03046
See application file for complete search history.

(56) References Cited

U.S. PATENT DOCUMENTS

| | | | |
|---|---|---|---|
| 6,580,089 B2 | 6/2003 | Bandara et al. | |
| 7,737,411 B2 | 6/2010 | Gunapala et al. | |
| 8,217,480 B2 | 7/2012 | Ting et al. | |
| 8,399,910 B2 | 3/2013 | Scott et al. | |
| 2002/0125472 A1* | 9/2002 | Johnson | B82Y 20/00 257/21 |
| 2010/0072514 A1 | 3/2010 | Ting et al. | |
| 2010/0155777 A1 | 6/2010 | Hill et al. | |
| 2011/0031401 A1 | 2/2011 | Mitra et al. | |

(Continued)

OTHER PUBLICATIONS

Shtrichman et al., "High Operating Temperature epi-InSb and XBn-InAsSb Photodetectors," Semiconductor Devices, May 2012, Israel.

(Continued)

*Primary Examiner* — Selim Ahmed
(74) *Attorney, Agent, or Firm* — Terry M. Sanks, Esquire; Beusse Wolter Sanks & Maire, PLLC

(57) ABSTRACT

Embodiments described herein relate to a dual-band photodetector. The dual-band photodetector includes a barrier layer (10) disposed between two infrared absorption layers (8, 12) wherein the barrier layer (10) is lattice matched to at least one of the infrared absorption layers (8, 12). Furthermore, one infrared absorption layer includes dilute nitride to adjust the band gap to a desired cut-off wavelength while maintaining valence-band alignment with the barrier layer. Embodiments also relate to a system and processes for producing the photodetector fabricated from semiconductor materials.

21 Claims, 8 Drawing Sheets

(56) References Cited

U.S. PATENT DOCUMENTS

| | | |
|---|---|---|
| 2011/0233709 A1 | 9/2011 | Scott et al. |
| 2012/0074462 A1 | 3/2012 | Freundlich et al. |
| 2013/0146998 A1* | 6/2013 | Ting ............... H01L 31/02016 |
| | | 257/431 |
| 2013/0214373 A9 | 8/2013 | Scott et al. |

OTHER PUBLICATIONS

Maimon et al., "nNn Detector, an Infrared Detector with Reduced Dark Current and Higher Operating Temperature," Applied Physics Letters 89, 151109, 2006.
Broderick et al., "Band Engineering in Dilute Nitride and Bismide Semiconductor Lasers," Semicond. Sci. Technol., 27, 094011, 2012.
Klem et al., Comparison of nBn and nBp Mid-Wave Barrier Infrared Photodetectors, Proc. of SPIE, vol. 7608, 2010.

* cited by examiner

TWO-COLOR BARRIER PHOTODETECTOR WITH DILUTE-NITRIDE ACTIVE REGION

CROSS-REFERENCE TO RELATED APPLICATION

This application claims priority benefit of U.S. Provisional No. 62/036,751 filed Aug. 13, 2014, which is incorporated herein by reference in its entirety. This application also claims the benefit of U.S. Provisional No. 62/036,759 filed Aug. 13, 2014, incorporated herein by reference in its entirety.

BACKGROUND

The disclosure relates to micro-imaging devices, particularly dual-band (two-color) infrared photodetectors and imagers.

A photodetector sensitive to infrared wavelengths of light is also known as an infrared (IR) detector. IR detectors are used in a wide variety of applications including thermal detection for surveillance, tracking, night vision, search and rescue, non-destructive testing and gas analysis. Typically, an IR detector is formed as a device consisting of an array, usually rectangular, of IR-sensing photodetectors disposed at the focal plane of an imaging lens. Such a detector is commonly referred to as a focal plane array (FPA).

IR covers a broad range of wavelengths, and therefore the IR band is further divided into sub-bands including: near IR (0.75 to 1.0 μm); short-wavelength IR (1.0 to 3.0 μm) (SWIR band); mid-wavelength IR (3 to 5 μm) (MWIR band); and long-wavelength IR (8 to 14 μm) (LWIR band). Many IR-absorbent materials are only sensitive to a certain range of wavelengths of IR radiation. Furthermore, IR radiation in the range of 5 to 8 μm is not transmitted well in the atmosphere. Therefore, many contemporary IR detectors are being designed to sense longer wavelengths falling within the 3 to 5 μm atmospheric window portion of the MWIR band, as well as wavelengths falling within the LWIR band.

IR photodetectors are often produced using InSb and HgCdTe materials fabricated as p-n junction diodes. However, these thermal detectors require cooling to cryogenic temperatures of around 77K, which is complex, energy and volume consuming, and costly. The cryogenic temperatures are primarily used to reduce the dark current generated in, for example, the p-n junctions of the bulk materials and at the surface of the material by Shockley Reed Hall (SRH) generation.

Dark current affects many photosensitive devices and is characterized by a relatively small electric current that flows through the device even when no photons are entering the device. Dark current is one of the main sources of noise in image detectors such as IR detectors, and has traditionally been mitigated by operating the detectors at temperatures significantly below ambient (room) temperature. Dark current occurs due to the random generation of electrons and holes within the device. In the depletion region of certain IR photodetectors, the activation energy for generation is lowest, limiting the suppression of noise with reduced temperature.

The dominant approach to two-color IR detectors is currently the mercury-cadmium-telluride (HgCdTe, or referred to as "MCT"). The MCT approach can be well suited to MWIR and LWIR detection because the band gap of such materials—which depends on the mixture of mercury and cadmium—can be tuned by more than an order of magnitude (from less than 0.1 eV to greater than 1.0 eV). This ability to adjust the band gap based on the makeup of a semiconductor alloy is known as "band gap engineering."

Photodetectors fabricated from MCTs and other semiconductor materials can be produced using deposition techniques such as liquid phase epitaxy or molecular beam epitaxy (MBE). As an illustration of such a process, MBE can be used to grow an HgCdTe layer under high-vacuum conditions starting with a CdZnTe (CZT) substrate that has a lattice spacing which closely matches HgCdTe. Such matching of lattice spacing is known as lattice matching. The MBE system evaporates and deposits Hg, Cd and Te onto the substrate in such a fashion that the mixtures of Hg, Cd, Te, and any additional dopants, can be precisely controlled-thus enabling band gap engineering of the resulting semiconductor layer.

The development of multispectral detectors based on MCT has been hindered by the size and cost of commercially available substrates as well as the difficulties associated with uniformity and correctability of the passivated p-n junction devices.

One approach to addressing the issue of dark current involves using Ga-free strained-layer superlattice (SLS) materials in barrier IR detectors. The strain of SLS materials facilitates suppression of inter-band tunneling and Auger recombination processes that lead to dark current. Moreover, the larger effective mass in SLS systems can lead to a reduction of tunneling current compared with MCT detectors of the same band gap. The barrier detector structure provides a unipolar surface (either n-type or p-type) that can be passivated. Ga-free SLS systems (such as InAs/InAsSb) maintain the ability to reach the LWIR absorption bands on GaSb substrates without suffering the surface passivation issues that plagued earlier GaSb/InAs type-II superlattice absorbing materials. However, the nature of Ga-free SLS detectors results in relatively low absorption strength and hole mobility which can affect the ultimate quantum efficiency that is attainable as well as the modulation transfer function.

SUMMARY

Embodiments of a barrier dual-band photodetector architecture and materials production process are described herein. The embodiments discovered enable the fabrication of dual-band (two-color) IR photodetectors that are capable of independently sensing in two bands such as the MWIR and LWIR radiation bands and which may be configured as focal plane arrays (FPAs) that should be capable of imaging in a high operating temperature (HOT) environment with low levels of noise and spectral cross talk.

An aspect of the embodiments include a photodetector, comprising: a first absorption layer of a bulk alloy having a predetermined doping type to absorb photons in a first infrared (IR) wavelength band of a first wavelength range; and a second absorption layer comprising a dilute nitride alloy having a predetermined doping type to absorb photons in a second IR wavelength band of a second wavelength range. The photodetector includes a barrier layer disposed between the first absorption layer and the second absorption layer. The first and second IR wavelength bands are spectrally separated with the first wavelength range being lower than the second wavelength range. The barrier layer and the second absorption layer have valence band energy aligned with the first absorption layer. At least one of the barrier layer and the second absorption layer is lattice matched to the first absorption layer.

A further aspect of the embodiments related to a system, comprising: a readout integrated circuit (ROIC); and a dual-band photodetector configured to collect photons in a first infrared (IR) wavelength band when a first bias is applied to the photodetector and collect photons in a second infrared (IR) wavelength band when a second bias is applied to the photodetector. The photodetector, comprising: a first absorption layer of a bulk alloy having a predetermined doping type to absorb photons in a first infrared (IR) wavelength band of a first wavelength range; and a second absorption layer comprising a dilute nitride alloy having a predetermined doping type to absorb photons in a second IR wavelength band of a second wavelength range. The photodetector includes a barrier layer disposed between the first absorption layer and the second absorption layer. The first and second IR wavelength bands are spectrally separated with the first wavelength range being lower than the second wavelength range. The barrier layer and the second absorption layer have valence band energy aligned with the first absorption layer. At least one of the barrier layer and the second absorption layer is lattice matched to the first absorption layer.

A still further aspect of the embodiments relate to a method, comprising: forming, for a photodetector, a first absorption layer of a bulk alloy having a predetermined doping type to absorb photons in a first infrared (IR) wavelength band of a first wavelength range; forming, for a photodetector, a second absorption layer comprising a dilute nitride alloy having a predetermined doping type to absorb photons in a second IR wavelength band of a second wavelength range; and forming, for a photodetector, a barrier layer disposed between the first absorption layer and the second absorption layer. The first and second IR wavelength bands are spectrally separated with the first wavelength range being lower than the second wavelength range. The barrier layer and the second absorption layer have valence band energy aligned with the first absorption layer. At least one of the barrier layer and the second absorption layer is lattice matched to the first absorption layer.

Together these and other disclosed innovations will allow the manufacture of low-cost, high-operating temperature (HOT) dual-band IR photodetectors compatible with, for example, infrared-search-and-track (IRST) and overhead persistent infrared (OPIR) applications.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1A:
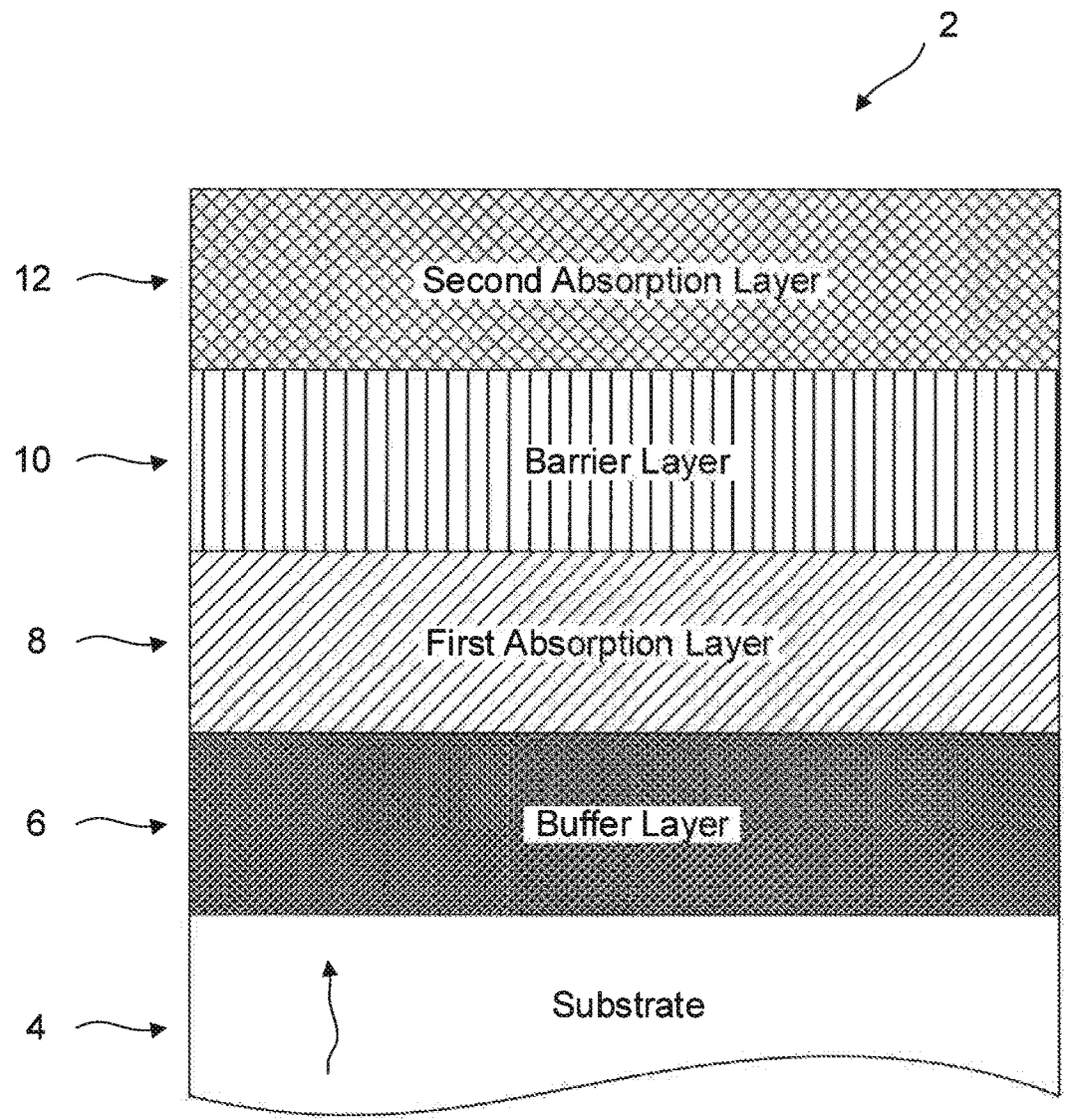
FIG. 1A is a cross-sectional illustration of a dual-band infrared (IR) photodetector with multi-layered, semiconductor materials.

Embodiments are described herein with reference to the attached figures in which reference numerals are used throughout the figures to designate similar or equivalent elements. The figures are not drawn to scale and they are provided merely to illustrate aspects disclosed herein. Several disclosed aspects are described below with reference to non-limiting applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

An nBn photodetector may be engineered in various ways to absorb a target IR waveband. The nBn nomenclature is representative of an n-doped photo absorbing layer, a barrier (B) layer and an n-doped contact layer. For example, these detectors may use a barrier layer whose minority carrier band edge lines up with the absorber minority carrier band edge so that carrier can be collected. The majority carrier band edge of the barrier is well above the contact or absorber band edge such that majority carriers are blocked or filtered—thus producing a so-called "majority carrier filter." In this construction, the thickness of the barrier layer is sufficient to prevent tunneling of majority carriers from the photo-absorption layer to the contact layer, and a barrier in the majority carrier energy band is sufficiently thick to block the flow of thermalized majority carriers from the photo-absorption layer to the contact layer. Importantly, the barrier layer may be engineered so as to not significantly block minority carriers when an appropriate bias voltage is applied.

Another important design aspect of an nBn detector relates to valence band alignment. In particular, for an n-doped photo-absorption layer the heterojunction between the barrier layer and the absorption layer is such that there is substantially zero valence band offset, i.e., the band gap difference appears almost exclusively in the conduction band offset. Alternatively, for a p-doped photo-absorption layer the heterojunction between the barrier layer and the absorption layer is such that there is substantially zero conduction band offset, i.e., the band gap difference appears almost exclusively in the valence band offset.

The emission wavelength of an IR detector may be extended by using bulk alloys. This approach may be particularly attractive due to the strong oscillator strength and high minority carrier mobility compared to the engineered superlattice or quantum confined materials.

In the area of band gap engineering, substitution of the group V anions in conventional III-V semiconductor alloys with small amounts of nitrogen can lead to dramatic changes in the electronic properties of the resulting nitrogen-containing III-V alloys, which are often referred to as dilute-nitride alloys. Alloying III-V compounds with small amounts of nitrogen can dramatically reduce the fundamental band-gap energy in dilute-nitride alloys. The unexpectedly strong effect of nitrogen (N) on the band gap is related to the fact that replacement of atoms, such as, but not limited to, with the much smaller and more electronegative N atom, leads to a large local perturbation of the crystal lattice potential.

The embodiment herein may be directed to micro-imaging devices with dual-band (two-color) IR photo detection. The embodiments herein may be directed to an IR photo-detector which is capable of imaging in both MWIR (3-5 µm) and LWIR (8-12 µm) bands. The embodiments herein may be directed to imaging in separate bands of either the MWIR or LWIR regions. By way of non-limiting example, an embodiment may include imaging in a first LWIR sub-band of 8-9 µm and a second LWIR sub-band 11-12 µm regions with high quantum efficiency in both bands/sub-bands using a materials technology that is amenable to producing spatially-collocated pixels (i.e., FPAs). Such a detector may be operate in a high operating temperature (HOT) environment (preferably at ambient temperature without cryogenic cooling) and with minimal spectral cross talk.

An embodiment may include two of the SWIR band, the MWIR band and the LWIR band. An embodiment may include two different sub-bands of the SWIR band, the MWIR band and the LWIR band.

Use of an nBn structure, such as by way of non-limiting example, allows an embodiment of a dual-band photodetector described herein to be operated with minimal to no depletion layer and, thus, the dark current is significantly reduced-even in a HOT environment.

Embodiments herein may include a dual-band IR photodetector configured to image at a high operation temperature (HOT) with a large formatted array. Dual-band IR photodetectors described herein may be used for a variety of search and track as well as targeting applications. IR search-and-track (IRST) and overhead persistent infrared (OPIR) applications may require IR photodetectors with advanced capabilities including spectral diversity. The IR photodetector disclosed herein permits imaging or detection in both the MWIR and the LWIR bands under HOT conditions, with high quantum efficiencies in both of these wavelength ranges via spatially-collocated pixels exhibiting minimal spectral cross talk.

This disclosure enables the production of highly integrated digital Focal Plane Arrays (FPAs) that can be configured as dual-band (two-color) IR detectors employing a detector capable of producing high quantum efficiency, diffusion-limited detector performance in a small pixel by reducing or eliminating the perimeter and surface leakage currents. The use of a dual-band nBn detector, in which at least one dilute-nitride III-V semiconductor absorbing in the LWIR region is tuned to accomplish required band gap and valence band alignment with another IR absorption layer across a unipolar barrier architecture, enables valence band alignment regardless of the LWIR absorber cut-off wavelength. In addition, because band bowing of the dilute nitride III-V alloy increases the electron mass for the dilute-nitride alloy, the absorption coefficient is dramatically improved. Furthermore, the hole mobility is not changed because the valence band dispersion is unaffected by the addition of nitrogen to the LWIR absorbing material.

Embodiments described herein may include semiconductor materials that can be used to fabricate a large variety of dual-band IR photodetectors. In an embodiment, a unipolar barrier layer may be disposed between two infrared absorption layers. In this embodiment, the barrier layer may be composed of a III-V semiconductor compound, and at least one of the infrared (IR) absorption layers comprises a nitrogen-containing III-V semiconductor compound (i.e., a III-N-V semiconductor compound). In such embodiments, the barrier layer is lattice-matched to at least one of the infrared (IR) absorption layers.

The term "unipolar" barrier is used herein to describe a barrier that can block one carrier type (electron or hole) and allows for nearly or completely unimpeded flow of the other type. In some embodiments the barrier layer prevents conduction of majority carriers (electrons) between absorbing and contact regions while allowing the transport of photo-generated minority carrier (holes) that can be converted into an output signal.

FIG. 1A is a cross-sectional illustration of a dual-band infrared (IR) photodetector 2 with multi-layered, semiconductor materials. The photodetector 2 comprises a substrate 4, a buffer layer 6, a first absorption layer 8, a barrier layer 10, and a second absorption layer 12. The substrate 4 is provided as a base for deposition and has deposited on one face the buffer layer 6 upon which the first absorption layer 8 is deposited. The barrier layer 10 is sandwiched between the (lower band) first absorption layer 8 and the (upper band) second absorption layer 12. As shown in FIG. 1A, in operation of the photodetector 2, incoming photons may be directed through a transparent substrate and then into the upper layers (i.e., layers 6, 8, 10 and 12) of the photodetector architecture wherein layers 8 and 12 are IR absorption layers. In an embodiment, the first band and the second band are not the same band ranges and spectrally separated. Furthermore, in some embodiments, the first band is a lower band having a first infrared (IR) wavelength band. The second band is an upper band having a second infrared (IR) wavelength band wherein the first IR wavelength band and the second IR wavelength band are not the same. In an embodiment, the absorption layers may be n-doped semiconductor layers.

In certain embodiments, at least one of the first absorption layer 8, the barrier layer 10, and the second absorption layer 12 is lattice matched to the substrate 4 or to the buffer layer 6. In other cases, at least two of these layers are lattice matched to the substrate 4 or to the buffer layer 6. In still other embodiments, each of the first absorption layer 8, the barrier layer 10, and the second absorption layer 12 may be lattice matched to a substrate 4 or to a buffer layer 6.

In embodiments, the first IR absorption layer 8 may be substantially continuous over the barrier layer 10 and the substrate 4 dimensions. In embodiments, the first absorption layer 8 is nearest the substrate and between the barrier layer 10 and the substrate 4. Various embodiments will now be described.

Figure 1B:
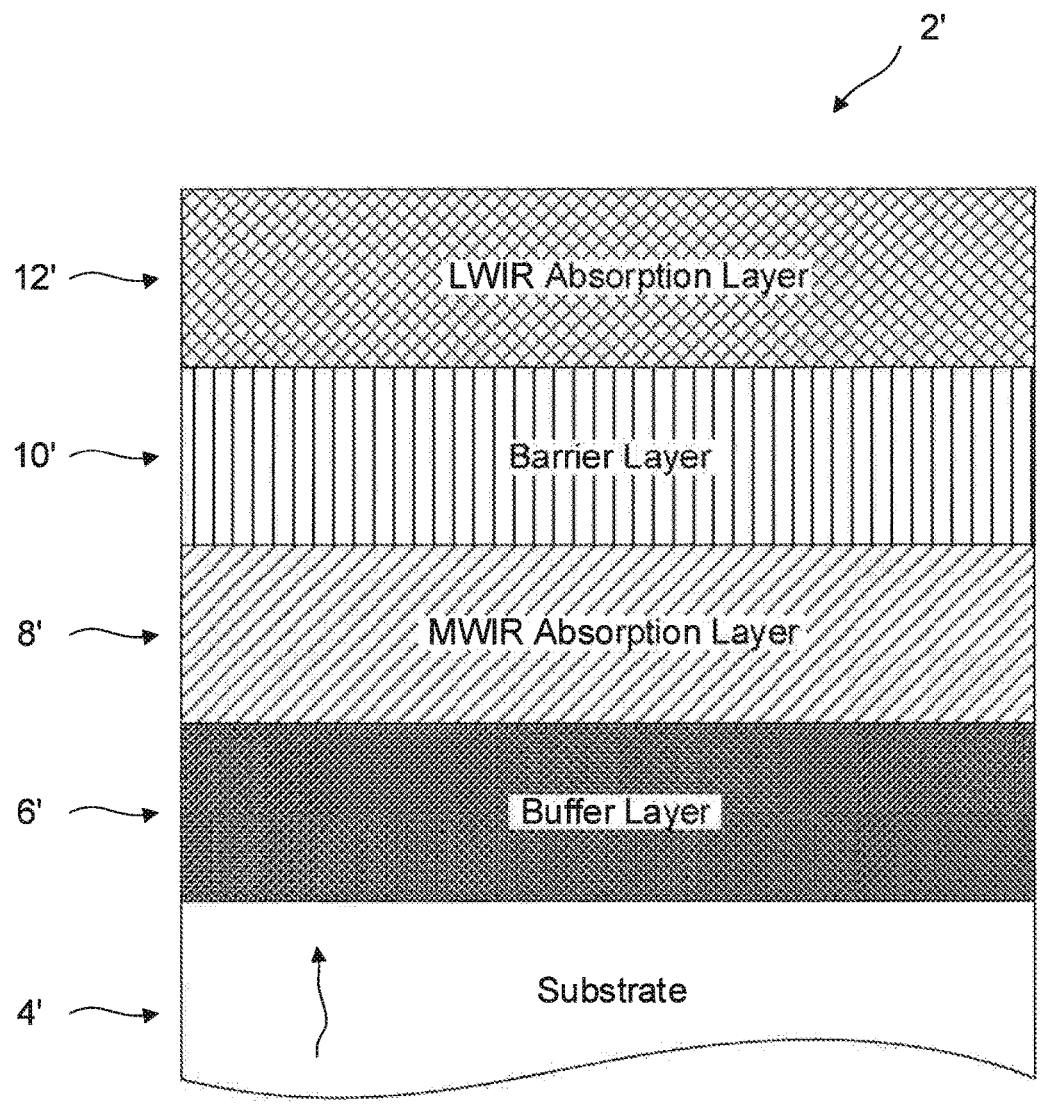
FIG. 1B is a cross-sectional illustration of a MWIR/LWIR photodetector with multi-layered, semiconductor materials.

FIG. 1B is a cross-sectional illustration of a MWIR/LWIR photodetector 2' with multi-layered, semiconductor materials. The MWIR/LWIR photodetector 2' comprises a substrate 4', a buffer layer 6', an MWIR absorption layer 8', a barrier layer 10', and an LWIR absorption layer 12'. The substrate 4' is provided as a base for deposition and has deposited on one face the buffer layer 6' upon which the MWIR absorption layer 8' is deposited. The barrier layer 10' is sandwiched between the (lower IR wavelength band) MWIR absorption layer 8' and the (upper IR wavelength band) LWIR absorption layer 12'. As shown in FIG. 1B, in operation of the photodetector 2', incoming photons may be directed through a transparent substrate and then into the upper layers (i.e., layers 6', 8', 10' and 12') of the photodetector architecture wherein the layers 8' and 10' are IR absorption layers. In an embodiment, the LWIR absorption layer 12' is tunable.

Some embodiments (such as shown in FIG. 1A or 1B) may include the buffer layer 6 or 6', but other embodiments exclude the buffer layer 6 or 6' such that the first absorption layer 8 or MWIR absorption layer 8' is directly applied to the substrate 4 or 4'. In some instances both the substrate 4 or 4' and the buffer layer 6 or 6' can be omitted.

In barrier structures suitable for use in dual-band photodetectors 2 or MWIR/LWIR photodetectors 2', the valence band of at least the barrier layer 10 or 10' is aligned to the valence band of the first absorption layer 8 or MWIR absorption layer 8'. In other structures, both the barrier layer 10 and 10' and the second absorption layer 12 or LWIR absorption layer 12' may be valence-band aligned to the valence band of the first absorption layer 8 or MWIR absorption layer 8'.

In certain embodiments, at least one of the MWIR absorption layer 8', the barrier layer 10', and the LWIR absorption layer 12' is lattice matched to the substrate 4' or to the buffer layer 6'. In other cases, at least two of these layers are lattice matched to the substrate 4' or to the buffer layer 6'. In still other embodiments, each of the MWIR absorption layer 8', the barrier layer 10', and the LWIR absorption layer 12' may be lattice matched to a substrate 4' or to a buffer layer 6'.

Suitable substrate materials may include, for example, InAs, InSb, InP, GaSb, and GaAs, but are not limited to these materials wherein In is indium; As is arsenic; Sb is antimony; P is phosphorus; and Ga is gallium.

In some embodiments, the absorption layer 8 or 8', the barrier layer 10 or 10', and the absorption layer 12 or 12' may contain III-V semiconductor compounds such that the III-V alloy of the absorption layer 12 or 12' is a dilute-nitride III-V alloy.

As used herein, the terms "III-V semiconductor," "III-V material," "III-V compound" and "III-V alloy" mean and include any semiconductor material that is at least predominantly comprised of one or more elements from group IIIA of the periodic table boron (B), aluminum (Al), gallium (Ga), indium (In), and titanium (Ti) and one or more elements from group VA of the period table nitrogen (N), phosphorus (P), arsenic (As), antimony (Sb) and bismuth (Bi)). For example, III-V materials may include, but are not limited to, GaN, GaAs, GaSb, InAs, AlAs, InGa, GaInAs, InAsSb, AlGaSb, etc. III-V alloys as defined above also include nitride-containing III-V alloys (also referred to as "III-N-V alloys") and dilute-nitride-containing III-V alloys (also referred to as "dilute III-N-V alloys" or "III-N-V alloys") in which group V anions of conventional III-V alloys are substituted with small amounts of nitrogen. Dilute III-N-V alloys include, for example, InNAsSb, GaAsN, GaInAsN, GaSbN, GaInSbN, GaAsSbN, InAsN, InSbN, etc.

One embodiment of the dual-band IR photodetector 2 with multi-layered, semiconductor materials of FIG. 1 is fabricated from a substrate 4 composed of GaSb or GaAs, a buffer layer 6 may be composed of GaSb, an absorption layer 8 or 8' may be composed of InAsSb, a barrier layer 10 or 10' may be composed of AlGaSb, and an absorption layer 12 or 12' may be composed of InNAsSb. In one example, the buffer layer 6' may be a GaSb layer having an approximate thickness of about 5000 Å, the MWIR absorption layer 8' may be a InAsSb layer having an approximate thickness of about 40000 Å, the barrier layer 10' may be an AlGaSb layer having an approximate thickness of about 3000 Å, and the LWIR absorption layer 12' may be an InNAsSb layer having an approximate thickness of about 20000 Å.

One non-limiting example, the dual-band photodetector 2 or the MWIR/LWIR photodetector 2' may configure to operate under HOT conditions. By way of non-limiting example, the photodetector 2' may be fabricated having an MWIR absorption layer 8' containing a III-V alloy defined by formula (I), a barrier layer 10' containing a III-V alloy defined by formula (II), and an LWIR absorption layer 12' containing dilute III-N-V alloy defined by formula (III):

$$InAs_aSb_{1-a} \tag{I}$$

$$Al_bGa_{1-b}As_cSb_{1-c} \tag{II}$$

$$InN_dAs_eSb_{1-e-d} \tag{III}$$

wherein:
the variable "a" ranges 0.80 to 0.91;
the variable "b" ranges from 0.9 to 1;
the variable "c" ranges from 0.07 to 0.09;
the variable "d" ranges from 0.01 to 0.05; and
the variable "e" ranges from 0.8 to 0.9.

The specific material used in the barrier layer 10 or 10; may not be critical as long as the valence and conduction bands are configured to produce either a majority carrier filter or a minority carrier filter as appropriate for a particular application. The barrier layer 10 or 10' may contain any suitable material such as, for example, AlSb, AlAsSb, AlGaSb, AlGaAsSb, AlPSb, AlGaPSb and HgZnTe.

Figure 4:
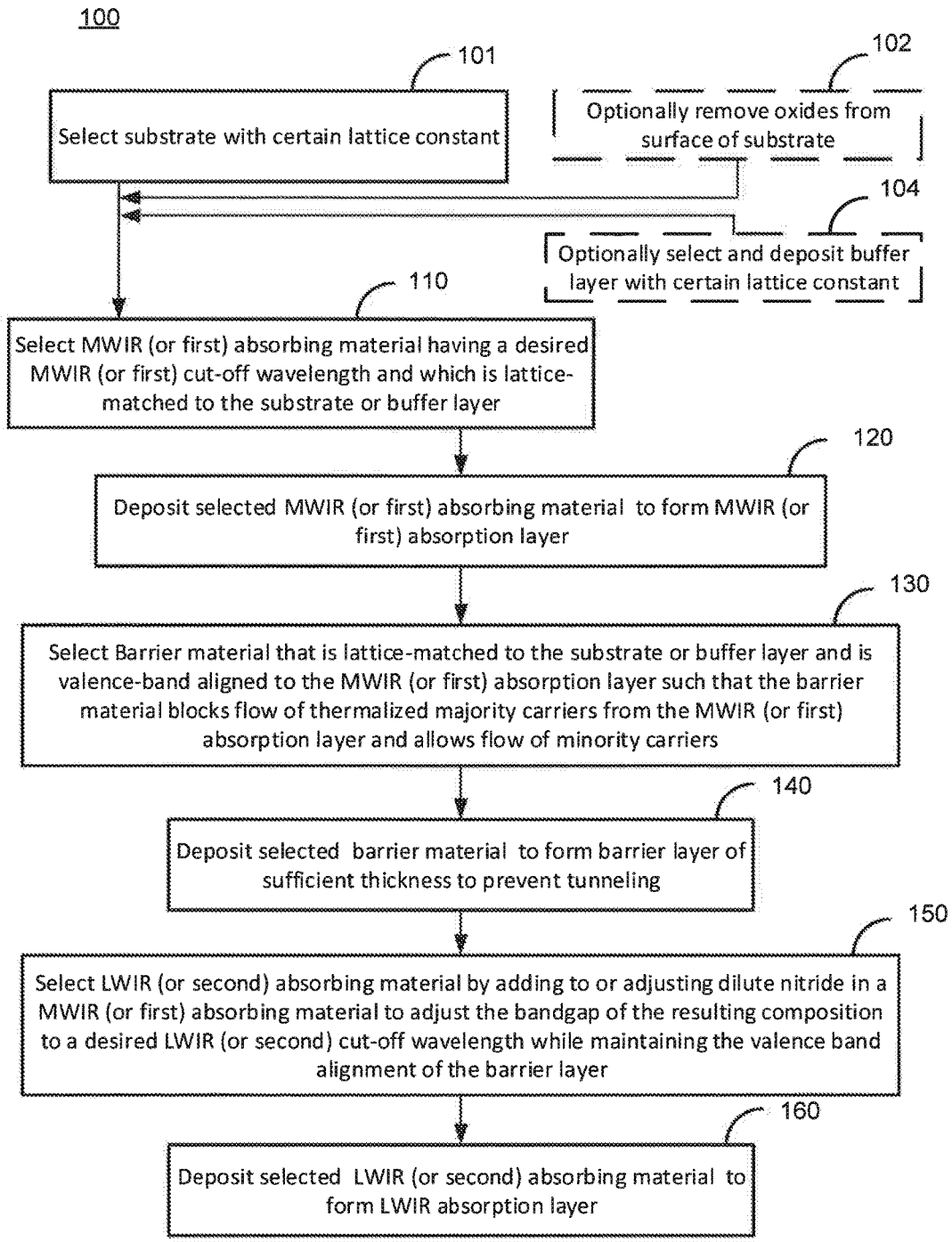
FIG. 4. is a flow chart of a process for manufacturing one embodiment of the dual-band IR photodetector with multi-layered, barrier semiconductor materials of FIG. 1.

As described in relation to FIG. 4, in an embodiment, the LWIR absorption layer 12' is created by starting with the material of the MWIR absorption layer 8' and then adding a nitrogen atoms to tune the LWIR absorption layer 12' to a LWIR cut-off wavelength.

The IR absorption layer 8 or 8', the barrier layer 10 or 10', and the IR absorption layer 12 or 12' may be fabricated as single layers, or may be fabricated as multi-layers. That is, one embodiment may include a multi-layered IR absorption layer 8 or 8' in a barrier structure in which the barrier layer 10 or 10' and the IR absorption layer 12 or 12' are each single layers. In some cases, all three of the IR absorption layer 8 or 8', the barrier layer 10 or 10' and the IR absorption layer 12 or 12' are themselves fabricated as multi-layers. In some embodiments, the barrier layer 10 or 10' may be constructed of multi-layers such that the level of valence-band matching can be varied along a thickness of the barrier layer 10 or 10' to accommodate other (less valence-band-matched) functional layers having beneficial properties. Other functional layers may include, by illustration, oxidation resistance layers and edge-stop layers.

The term "multi-layers" as used herein includes multiple layers of equivalent thickness or multiple layers of varying thickness.

In some embodiments a composition gradient is created in at least one of the IR absorption layers 8, 12 or 8', 12'. The gradient builds or results in an electric field promoting minority carrier transport to the barrier layer for charge separation and current collection. The composition gradient in an IR absorption layer allows for independent optimization of dark current and quantum efficiency radiation tolerance, which can be useful in certain applications (e.g., space technologies). The production or enhancement of a vertical electric field promotes current collection where charge is generated, thus reducing cross-talk and improving modulation transfer function (MTF). MTF is the amplitude of a spatially periodic signal detected by the detector as a function of the signal's spatial frequency. In embodiments employing a composition gradient, the dominant conduction mechanism is changed from diffusion (where the concentration gradient of minority carriers drives current) to drift (where electrostatic potential drives carrier collection). The use of composition gradients is compatible with bulk alloy absorption layers which have higher absorption coefficients and hole mobilities than superlattice alternatives.

In some embodiments employing a composition gradient the alloy composition in at least one of the IR absorption layers 8, 12 or 8'0.12' is varied or graded in a first section of the IR absorption layer, and ungraded in a second section of the IR absorption layer. In some embodiments the graded IR absorption layer is composed of a bulk III-V alloy such as AlInGaAs for example. The aluminum (Al) content of the alloy may be graded so that its band gap is largest near the junction with the substrate (or buffer) and is smallest near the junction with the barrier layer 10 or 10'. In such embodiments the concentration of a group-III element, such as aluminum, is decreased near the junction with the barrier layer 10 or 10'. For example, the content of aluminum (Al) may be decreased from about 5% to about 0% near the junction with the barrier layer 10 or 10'. Such a graded alloy results in a built-in electric field which improves collection efficiency of the minority carriers in a resulting photodetector 2 or 2'. Embodiments of graded absorption layers are described in U.S. application Ser. No. 14/825,501 filed Aug. 13, 2015, and having a common Applicant, the entirety incorporated herein.

Embodiments are not limited to the structure of the photodetector of FIG. 1A or 1B, but also include other functional layers which may be disposed between the heterojunctions of FIG. 1A or 1B. Furthermore, embodiments of the disclosure are not limited to MWIR/LWIR semiconductor materials or bands.

Another embodiment relates to dual-band IR photodetectors comprising: a first absorption layer 8 composed of a first III-N-V alloy having a predetermined doping type to absorb long-wavelength (LW) infrared photons within a first range of LWIR wavelengths; a second absorption layer 12 composed of a second III-N-V alloy having a predetermined doping type to absorb long-wavelength (LW) infrared photons within a second range of LWIR wavelengths; and a barrier layer 10 composed of a III-V alloy and disposed between the first absorption layer 8 and the second absorption layer 12s wherein the first range and the second range are not the same. In some embodiments, the barrier layer 10 and the second absorption layer 12 associated for the second range of LW infrared photons may be valence band aligned to the first absorption layer 8, while at least one of the barrier layer 10 and the second absorption layer 12 is lattice matched to the first absorption layer 8. In an embodiment, the first range of IR wavelengths is lower than the second range of IR wavelengths.

The dilute-nitride-containing III-V alloys may be used in the LWIR absorption layer to fabrication the dual-band (two-color) IR photodetector tuned to detect cut-off wavelengths in the MWIR/LWIR or LWIR/LWIR absorption regions. The behavior of a semiconductor junction may depend on the alignment of the energy bands at the interface. This is especially true for nBn detectors in which ideally the heterojunction between the barrier layer and the absorption layer is engineered such that there is substantially zero valence band offset, i.e., the band gap difference appears almost exclusively in the conduction band offset.

The band gap of the adsorption layer 12 or 12' for example may be tuned while maintaining valence-band alignment with both the barrier layer 10 or 10' and the absorption layer 8 or 8', by modulating the content of nitrogen contained in the dilute-nitride-containing III-V alloy of the absorption layer 12 or 12'. This ability to precisely tune the band gap of the adsorption layer 12 or 12' is due in part to the observation that when nitrogen is added to a III-V alloy the band gap of the resulting dilute III-N-V alloy is reduced, but the valence band remains unchanged. This effect originates from an anti-crossing interaction between extended conduction-band states and localized N states as depicted in FIG. 2 and FIG. 3.

By way of non-limiting example, absorption layers 8 and 12 may both include the dilute-nitride-containing III-V alloy for LWIR/LWIR photodetectors.

Figure 2:
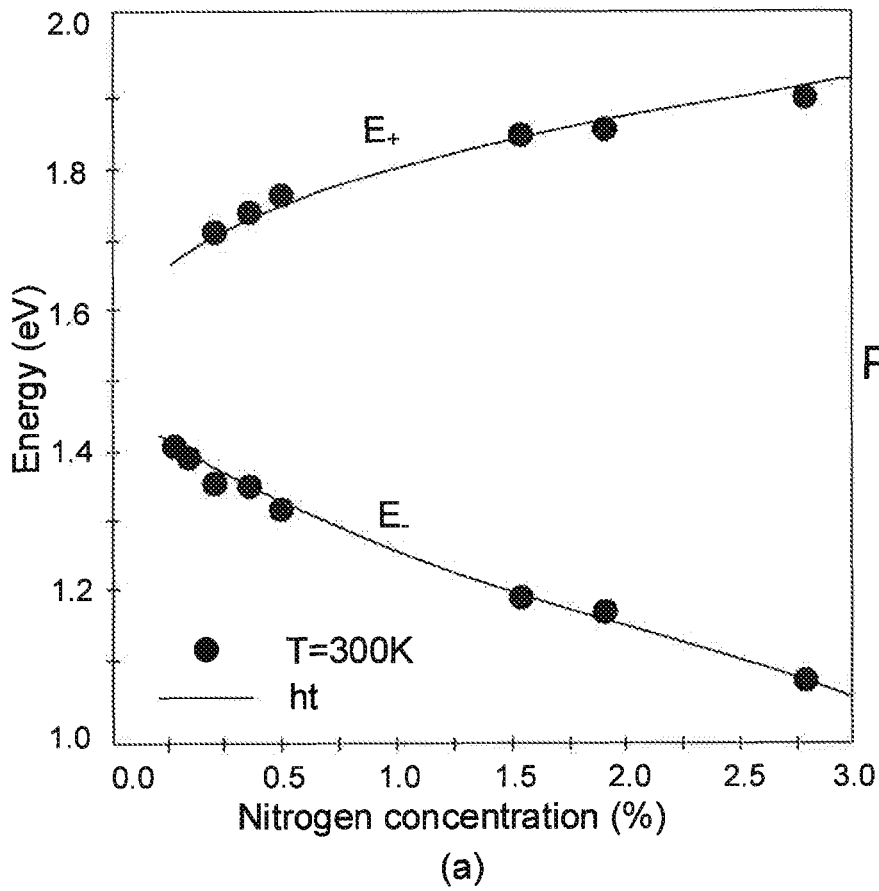
FIG. 2 is an energy diagram illustrating the phenomena of band anti-crossing and band bowing that occurs in a dilute-nitride containing III-V alloy as the concentration of nitrogen in the alloy is increased.

FIG. 2 is an energy diagram illustrating the phenomena of band anti-crossing and band bowing that is known to occur in a dilute-nitride containing III-V alloy as the concentration of nitrogen in the alloy is increased. See Broderick et al., 2012 Semicond. Sci. Technol. 27 094011. This figure shows that the addition of nitrogen to the III-V alloy results in a splitting of the conduction band into two distinct sub-bands ($E_+$ and $E_-$), which become further separated as the concentration of nitrogen increases (from left to right). The downward shift of the lower conduction sub-band edge ($E_-$) is responsible for the N-induced reduction of the fundamental band-gap energy. As shown in FIG. 3, the presence of nitrogen causes band anti-crossing which repels the conduction band to a higher energy level.

Figure 3:
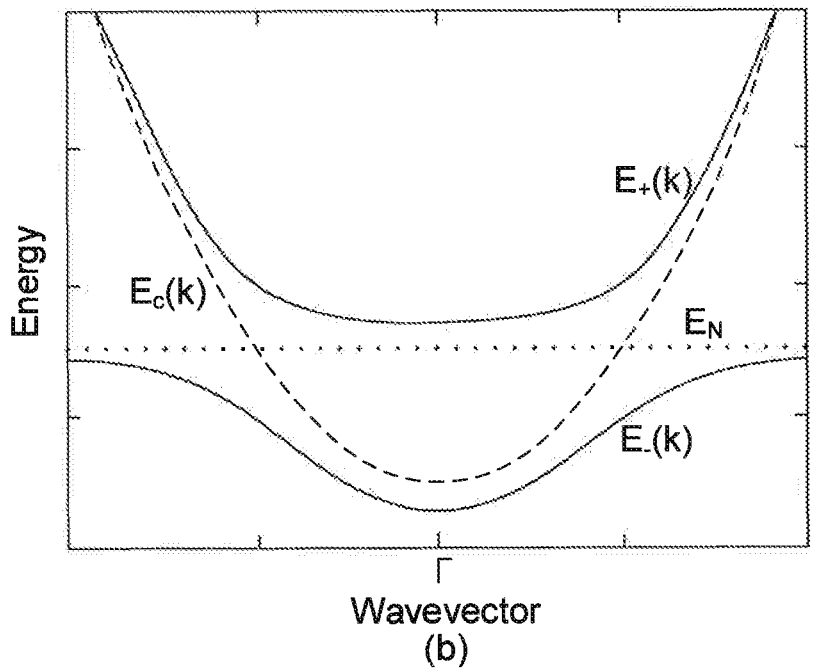
FIG. 3 is a band structure plot illustrating the effect of nitrogen content on band anti-crossing and band bowing in which increased nitrogen content increases band bowing and repels the conduction band upward.

FIG. 3 is a band structure plot illustrating the effect of nitrogen content on band anti-crossing and band bowing. See Broderick et al., 2012 Semicond. Sci. Technol. 27 094011. The unexpectedly strong effect of nitrogen on the band gap in dilute III-N-V alloys is related to the fact that the replacement of atoms such as arsenic (As) with the much smaller and more electronegative N atom leads to a large local perturbation of the crystal lattice potential. As shown in FIG. 3, nitrogen creates a level $E_+(k)$ that is above the conduction band $E_c(k)$ which causes the band anti-crossing to form the conduction $E_+(k)$ and $E_-(k)$ bands that are divided at the nitrogen $E_N$ level. Moreover, as the concentration of nitrogen increases more band bowing occurs which repels the conduction band $E_+(k)$ upward.

The use of dilute-nitride-containing III-V alloys may provide benefits suited to dual-band, MWIR/LWIR or LWIR/LWIR photodetectors. First, the band bowing of the dilute III-N-V alloys causes the electron effective mass to increase significantly such that the absorption coefficient is dramatically improved. Second, the hole mobility is not changed because the valence band dispersion is unaffected by the presence of nitrogen atoms.

FIG. 4 illustrates a flow chart for a process 100 for manufacturing an embodiment of a multi-layered, semiconductor structure for a dual-band IR photodetector (i.e., photodetector 2 or 2'). The photodetector may be an nBn photodetector where n represents an n-doped semiconductor. The embodiment of the photodetector 2 or 2' in FIG. 1A or 1B, for example, can be produced using the process 100 depicted in FIG. 4.

In an embodiment the process 100 begins by selecting, in step 101, a substrate (i.e., substrate 4 or 4') having a certain lattice constant. The substrate is selected to be transparent. Oxides may likely be present on the surface of the substrate and may optionally be removed, in step 102, represented in a dashed line box. In optional step 104, represented in a dashed line box, a buffer layer (i.e., buffer layer 6 or 6') having a certain lattice constant may be selected and deposited onto the surface of the substrate. In step 110, an MWIR (or first) absorbing material having a desired MWIR (or first) cut-off wavelength and which is lattice-matched to the substrate or buffer layer is selected and, in step 120, the selected MWIR (or first) absorbing material is then deposited onto the substrate or buffer layer to form a MWIR (or first) absorption layer (i.e., IR absorbing layer 8 or 8').

In step 130, a barrier material that is lattice-matched to the substrate or buffer layer and which is valence-band aligned to the MWIR (or first) absorption layer is selected-such that the selected barrier material may block the flow of thermalized majority carriers from the MWIR (or first) absorption layer while allowing the flow of minority carriers. In step 140, the selected barrier material is deposited onto the surface of the MWIR (or first) absorption layer to form a barrier layer (i.e., barrier layer 10 or 10') of sufficient thickness to prevent tunneling. In step 150, an LWIR (or second) absorbing material is selected by adding to or adjusting dilute nitride in the MWIR (or second) absorbing material in order to adjust the band gap of the resulting dilute III-N-V alloy to a desired LWIR (or second band) cut-off wavelength while maintaining the valence-band alignment to the barrier layer. In step 160, the selected LWIR (or second) absorbing material is deposited onto the surface of the barrier layer to form an LWIR (or second) absorption layer (i.e., IR absorption layer 12 or 12').

Photodetector materials produced by, for example, the process 100 depicted in FIG. 4, may be physically grown using liquid phase epitaxy (LPE), molecular beam epitaxy (MBE), metal-organic chemical deposition (MOCVD), or by other methods known to those skilled in the art on substrate materials such as InSb, InAs, InP, GaSb, GaAs, etc.

One embodiment amenable to the production of III-V semiconductors having a tunable LWIR absorption layer containing a dilute III-N-V alloy advantageously employs an MBE growth process in which group III effusion cells are used to deposit Ga, In and Al, valved crackers are used to deposit group V elements Sb and As, and a radio frequency (RF) inductively-coupled (IC) plasma is used to deposit elemental nitrogen. Deflection plates positioned external to the plasma cell may also be used to direct high energy ions away from the growing semiconductor.

A wide variety of dual-band IR photodetectors can be fabricated from semiconductor materials of the disclosure.

Figure 5:
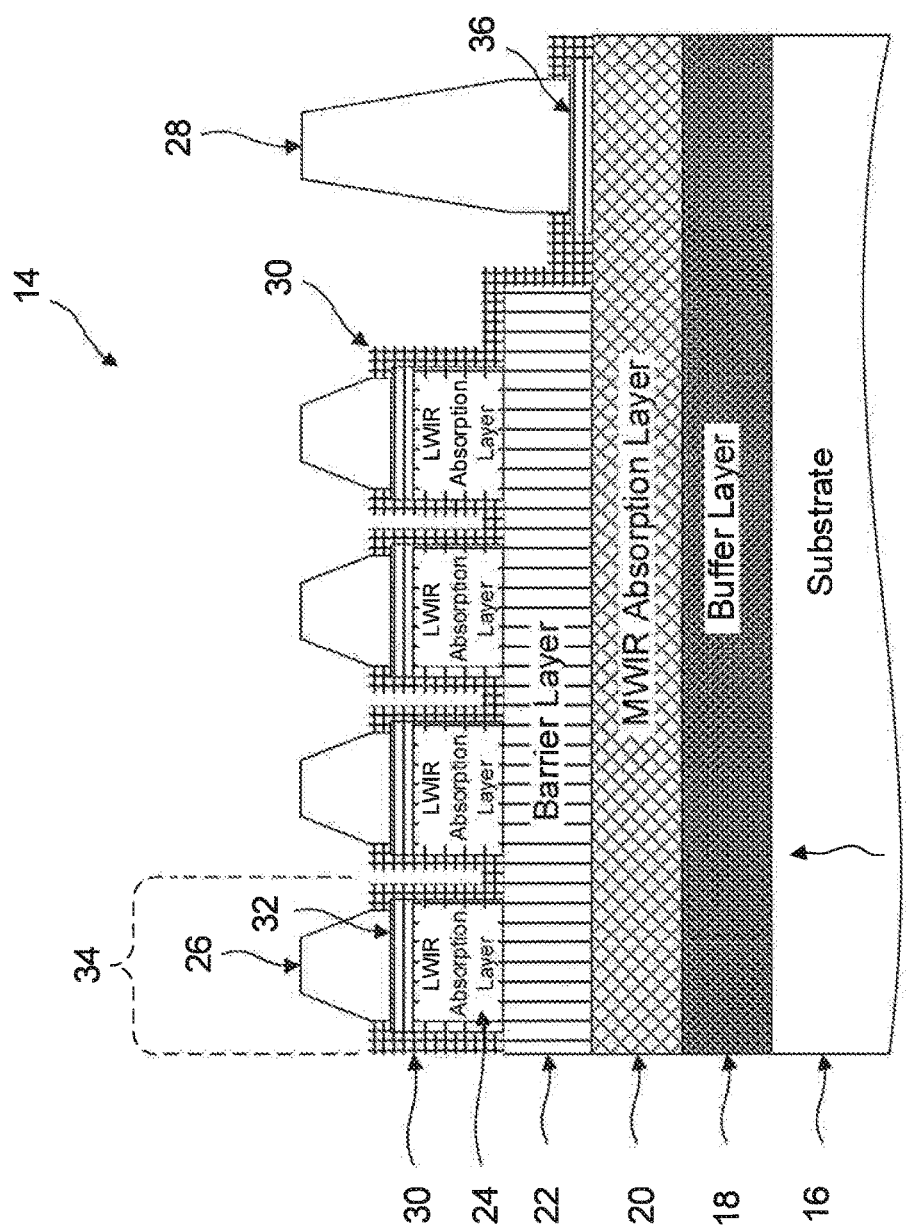
FIG. 5 is a cross-sectional illustration of a MWIR/LWIR photodetector.

FIG. 5 is a cross-sectional illustration of a dual-band (MWIR/LWIR) photodetector 14 which is capable of being manufactured using the process 100 depicted in FIG. 4. In this embodiment, the photodetector 14 comprises a buffer layer 18 sandwiched between a substrate 16 and a MWIR absorption layer 20, and a barrier layer 22 sandwiched between the MWIR absorption layer 20 and a plurality (array) of LWIR absorption layers 24 which are divided into a plurality of contact regions (pixels) 34. In another embodiment, the MWIR absorption layer 20 may be replaced with another LWIR absorption layer which has a lower IR wavelength in the LWIR band than the IR wavelength of the LWIR absorption layer 24.

Each contact region (pixel) 34 contains a metallic active layer 32 (attached to a corresponding LWIR absorption layer 24) and a passivated area or layer 30. Each contact region 34 includes a pixel bump 26. A ground 28 is attached to the MWIR absorption layer 20. The passivated area or layer 30 extends along each contract region (pixel) 34 and specifically along and between each discrete LWIR absorption region of the LWIR absorption layer 24. The passivated area or layer 30 extends from the metallic active layer 32 down to the barrier layer 22 along sides of the LWIR absorption region. A portion of the passivated area or layer 30 overlaps over a portion (upper corners) of the metallic active layer 32. The pixel bump 26 extends through and above the passivated area or layer 30. The passivated area or layer 30 may extend along the shoulder of the barrier layer 22 adjacent to the ground 28. The passivated area or layer 30 may extends over the MWIR absorption layer 20 and over a portion of the metallic contact layer 36. The metallic contact layer 36 may be below the ground 28. The ground 28 may be surrounded by and extend above and through the passivated area or layer 30. The passivated area or layer 30 may be a dielectric, such as, without limitation SiN (silicon Nitride).

In operation of the photodetector 14 of FIG. 5, the barrier layer 22 presents a high barrier to carrier flow in the conduction band of either the MWIR absorption layer 20, or the LWIR absorption layers 24, depending upon whether the photodetector 14 is operating in forward-bias or reversed-bias mode. This enables the photodetector 14 to sense MWIR photons absorbed by the MWIR absorption layer 20 and to sense LWIR photons absorbed by the LWIR absorption layers 24, by placing a forward or reverse bias, respectively, across the pixel bumps 26 and the ground 28. When applying a forward or a reverse bias, the barrier layer 22 presents a high barrier to carrier flow in the conduction band, but a negligible barrier to carrier flow in the valence band. This enables a bias to be placed across the device without majority carrier current flow, while allowing the collection of photo-generated minority carriers by diffusion.

The photodetector 14 is a bias-switchable photodetector, wherein the photodetector is switchable between a forward bias and a reverse bias such that as the bias is switched, the detector is sensitive each of the spectral bands.

Figure 6A:
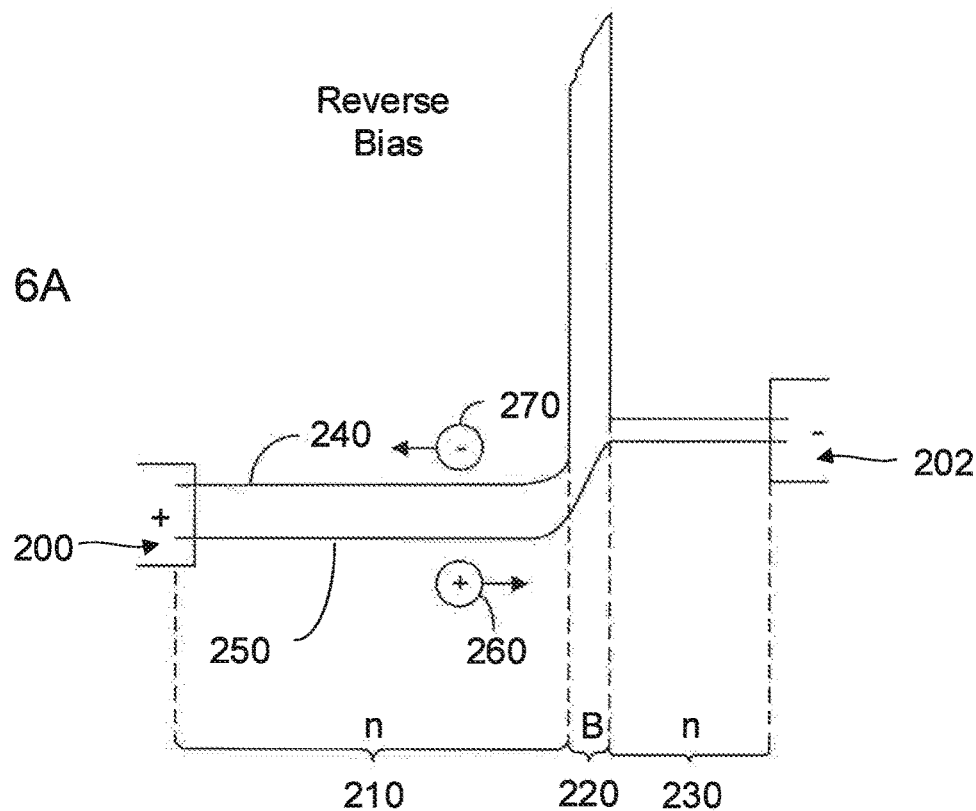
FIGS. 6A and 6B illustrate band diagrams that depict the effects of applying a reverse bias or a forward bias on the dual-band (two-color) MWIR/LWIR photodetector of FIG. 5.
Figure 6B:
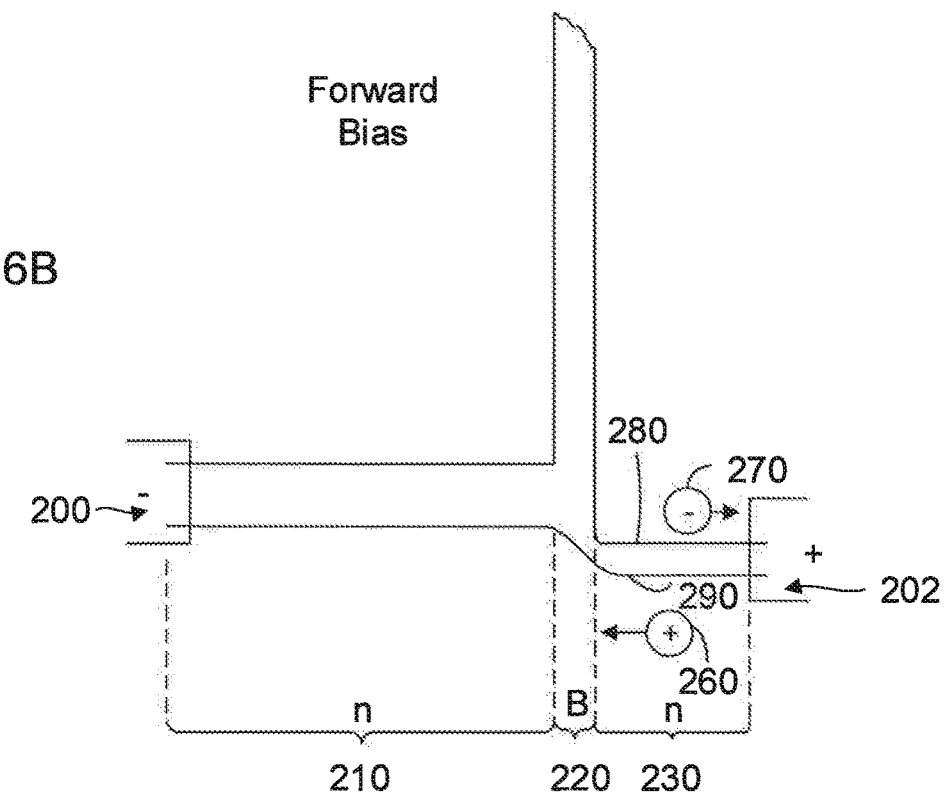

The operation of photodetectors such as that depicted in FIG. 5 is also explained by reference to FIGS. 6A and 6B. FIGS. 6A and 6B illustrate band diagrams of the effects of applying a reverse bias or a forward bias on the dual-band MWIR/LWIR photodetector of FIG. 5. That part of the band diagrams associated with the barrier layer 220 is identified as such and is labeled with the letter "B," and those parts of the band diagrams associated with the MWIR absorption layer 210 and the LWIR absorption layer 230 are identified as such and are labeled with the letter "n" where n represents an n-doped semiconductor absorption layer.

In the diagram of FIG. 6A a reverse bias is applied to the ground 200 and the pixel 202, such that the ground 200 is held at a positive potential with respect to that of the pixel 202. The upper band 240 is the conduction band, and the lower band 250 is the valence band, of the MWIR absorption layer 210. Upon contact of the MWIR absorption layer 210 with a photon having the proper MW cut-off frequency, a hole-electron pair comprising a hole 260 and an electron 270 are generated in the MWIR absorption layer 210 due to adsorption of the photon. Because of the potential difference between the ground 200 and the pixel 202, the electron 270 moves towards the ground 200 and the hole 260 moves towards the pixel 202.

Thus, when a reverse bias is applied, any photon that is absorbed in the MWIR absorption layer 210 has the capability to be collected and converted into a photocurrent. Importantly, any photon that is absorbed in the LWIR absorption layer 230 under these conditions cannot achieve charge separation because high barriers (high energy band levels) exist to both holes and electrons, as shown in the band diagram adjacent to the pixel 202. Consequently, no current is observed corresponding to photons absorbed in the LWIR absorption layer 230.

In the diagram of FIG. 6B, a forward bias is applied to the ground 200 and the pixel 202, such that the ground 200 is held at a negative potential with respect to that of the pixel 202. The upper band 280 is the conduction band, and the lower band 290 is the valence band, of the LWIR absorption layer 230. Upon contact of the LWIR absorption layer 230 with a photon having a proper LW cut-off frequency, a hole-electron pair comprising a hole 260 and an electron 270 are generated in the LWIR absorption layer 230 due to adsorption of the photon. Because of the potential difference between the ground 200 and the pixel 202, the electron 270 moves towards the pixel 202 and the hole 260 moves toward the ground 200.

Thus, when a forward bias is applied any photon that is absorbed in the LWIR absorption layer 230 has the capability to be collected and converted into a photocurrent. Importantly, any photon that is absorbed in the MWIR absorption layer 210 under these conditions cannot achieve charge separation because high barriers (high energy band levels) exist to both holes and electrons, as shown in the band diagram adjacent to the ground 200. Consequently, no current is observed corresponding to photons absorbed in the MWIR absorption region 210.

The disclosure is not limited to MWIR/LWIR photodetectors of FIG. 5, but may include a wide variety of photodetectors.

Another embodiment relates to a photodetector containing a barrier layer disposed between two IR absorption layers, such that the barrier layer is composed of a III-V alloy and is lattice matched to at least one of the IR absorption layers. In this embodiment, at least one of the two IR absorption layers is a LWIR absorption layer composed of a III-N-V alloy having a predetermined doping type to absorb long-wavelength infrared photons. The LWIR absorption layer is subdivided into a plurality of LWIR contact regions, each contact region having an active area and a passivated area. In this embodiment the barrier layer is disposed between the LWIR absorption layer and a second IR absorption layer, such that the barrier layer and the LWIR absorption layer are valence band aligned to the second IR absorption layer and at least the barrier layer is lattice matched to the second IR absorption layer.

Returning again to the process for fabricating a dual-band photodetector, such as the dual-band (two-color) MWIR/LWIR photodetector 14 of FIG. 5. The process may further include steps for forming a pixel array.

In one process a metallic contact layer (progenitor of the metallic active area 32 shown in FIG. 5) may be deposited onto the LWIR absorption layer 12 or 12' such as the embodiment depicted in FIGS. 1A and 1B. The contact layer 32 is pixel patterned with a pixel delineation mask and is etched to define contact regions 34 of an array of pixels 26. An exposed portion of the metallic contact layer is etched down to the barrier layer 22. Outside of the pixel region, the metallic contact layer 36 is etched down to the MWIR (or first) absorption layer 20. A metallic contact layer 36 is deposited onto the exposed surface of the MWIR (or first) absorption layer 20. Contact bumps are then deposited onto the metallic contact layers 32, 36 to form an array of detector pixels 26 attached to the barrier layer 22 and to form a ground 28 attached to the MWIR (or first) absorption layer 20. The resulting photodetector 14 may then be attached to an electronic support package (e.g., a readout integrated circuit (ROIC)) (FIG. 9) to produce a dual-band (two color) MWIR/LWIR photodetector 14 capable of selectively applying a forward or reverse bias to sense absorption at either the LWIR absorption layer(s) 24 or the MWIR absorption layer 20, respectively. As can be appreciated, in certain embodiments, the MWIR absorption layer 20 would substituted with a first absorption layer 8 and the LWIR absorption layer(s) 24 would be substituted with a second absorption layer 12 such that the first band and the second band are different (not the same) and the first band having a IR wavelength range which is lower than the IR wavelength range of the second band.

Dual-band or MWIR/LWIR photodetector embodiments are expected to possess remarkably improved spectral quantum efficiencies that greatly exceed the quantum efficiencies of other known barrier detectors such as those based on Ga-free strained-layer superlattice (SLS) materials. Current Ga-free SLS detectors possess comparatively low quantum efficiencies because of the relatively low absorption strength and hole mobility for reaching useful cut-off wavelengths. By contrast, as shown in FIGS. 7 and 8, relatively high quantum efficiencies are expected to be possible for embodiments disclosed herein.

Figure 7:
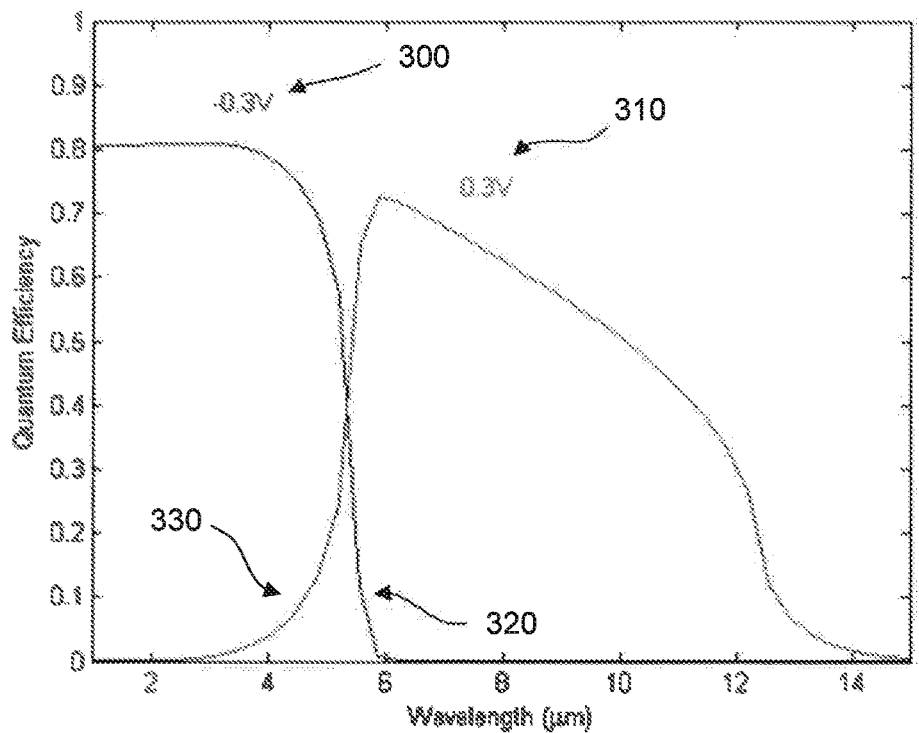
FIG. 7 is a plot of spectral quantum efficiency versus wavelength showing the effects on quantum efficiency when a reverse bias (−0.3V) is applied and when a forward bias (+0.3V) is applied to the dual-band (two-color) MWIR/LWIR photodetector of FIG. 5.
Figure 8:
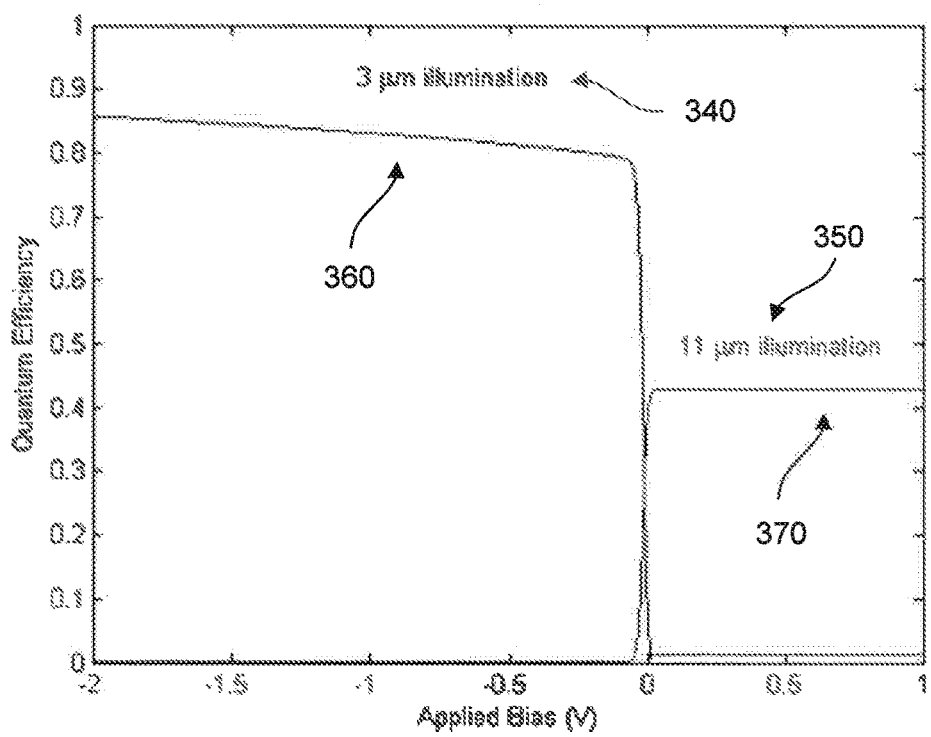
FIG. 8 is a plot of spectral quantum efficiency versus applied bias voltage showing the effects on quantum efficiency when a reverse or forward bias is applied to the dual-band (two-color) MWIR/LWIR photodetector of FIG. 5 with respect to a 3 μm (MWIR) photo-illumination and an 11 μm (LWIR) photo-illumination.

FIG. 7 is a plot of spectral quantum efficiency versus wavelength showing the predicted effects on quantum efficiency when a reverse bias 300 of −0.3 V is applied, and when a forward bias 310 of +0.3 V is applied, to the dual-band (two-color) MWIR/LWIR photodetector 14 of FIG. 5. When the reverse bias 300 of −0.3 V is applied, the corresponding reverse-bias plot 320 shows that the quantum efficiency in the MW range of wavelengths is expected to be over 50%. In the 3-5 µm range, the calculation predicts that the quantum efficiency will range from approximately 85% to approximately 50%. When the forward bias 310 of +0.3 V is applied, the corresponding forward-bias plot 330 shows that the quantum efficiency in the LW range of wavelengths is expected to be over 30% for cut-off wavelengths from 8 µm to approximately 12.5 µm. In the 7-10 µm range, the calculation predicts that the quantum efficiency will range from approximately 70% to approximately 50%.

While the plot of FIG. 7 shows the predicted results for non-limiting detector of FIG. 5, in other embodiments additional optimization of the photodetector structure (in terms of both materials employed and physical dimensions) can independently or collectively increase the quantum efficiencies in both the MW and the LW wavelength ranges. Higher or lower quantum efficiencies can be obtained by altering the thickness or thicknesses of the MWIR and LWIR absorption layers. For instance, in another embodiment the thickness of the LWIR (second) absorption layer 12, 12', 24 is increased such that the quantum efficiency in the LW region equals or exceeds that of the MW region. The thickness of the MWIR (first) absorption later 8, 20 can also be increased to produce higher quantum efficiencies in the MW range of wavelengths. In some embodiments, a thickness of the MWIR (first) absorption layer 8, 8', 20 is limited to not exceed a diffusion length of the MWIR (first) absorption material. In such embodiments, exceeding the diffusion length of the MWIR (first) absorption material can lead to a reduction in quantum efficiency. In some embodiments, the thickness of the LWIR (second) absorption layer 12, 12', 24 may also be limited due to a possible reduction in second pass absorption.

Another non-limiting feature involves the ability to reduce spectral crosstalk by increasing the thickness of the MWIR (first) absorption layer 8, 8', 20. As shown in FIG. 7, there is spectral crosstalk between the MWIR and LWIR absorption regions in the 4-6 µm region where both layers exhibit significant and overlapping quantum efficiencies. The typical solution to address spectral crosstalk in dual-band detector is to employ an optical filter positioned in front of the detector array in order to filter photons within the crosstalk region. A non-limiting advantage of the disclosure is that photo absorption of the MW absorption region increases as the thickness of the MW absorption layer increases. Therefore, in some embodiments the thickness of the MW absorption layer is increased, or a multi-layered MW absorption layer is employed, to reduce spectral crosstalk.

FIG. 8 is a plot of spectral quantum efficiency versus applied voltage showing the predicted effects on quantum efficiency when the reverse bias 300 of −0.3 V, or the forward bias 310 of +0.3 V, is applied (see FIG. 7) to the non-limiting dual-band (two-color) MWIR/LWIR photodetector of FIG. 5 with respect to a 3 µm (MWIR) photo-illumination 340 and a 11 µm (LWIR) photo-illumination 350. When the reverse bias 300 is applied, the corresponding reverse-bias plot 360 for the 3 µm photo-illumination 340 shows that the quantum efficiency is expected to be over 80% for applied bias voltages of greater than (in magnitude) approximately −0.2 V. When the forward bias 350 is applied, the corresponding forward-bias plot 370 for the 11 µm photo-illumination 350 shows that the quantum efficiency is expected to be over 40% for applied bias voltages of greater than (in magnitude) approximately +0.1 V.

While the plot of FIG. 8 shows the predicted results for the photodetector of FIG. 5, additional optimization of detector structure (in terms of both materials employed and physical dimensions) may be conducted to increase the quantum efficiencies in the MW and LW wavelength ranges. For instance, increasing the relative thickness of the LWIR (second) absorption layer 12, 12', 24 can produce a detector in which the quantum efficiency in the LWIR (second) region equals or exceeds that of the MWIR absorption layer 8, 8', 20.

Figure 9:
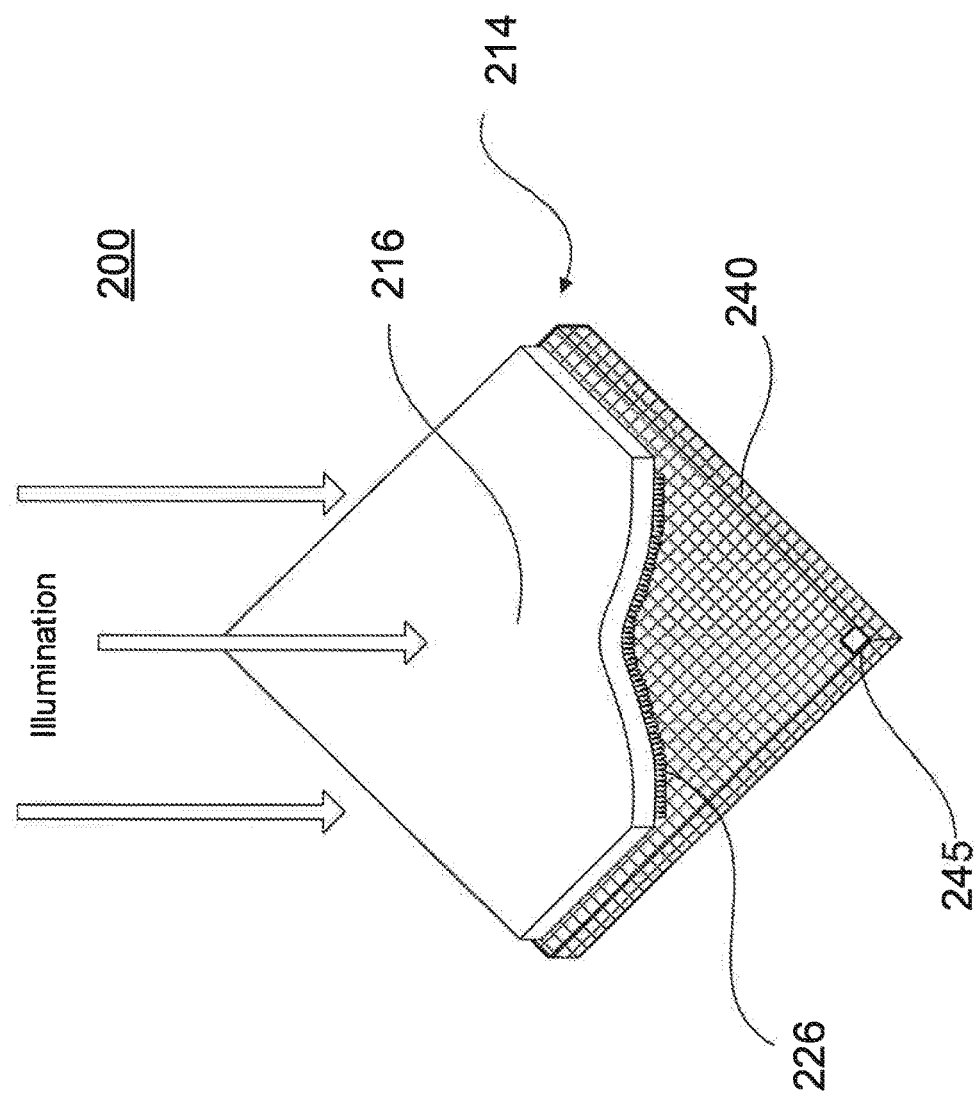
FIG. 9 is an illustration of a system for detecting two infrared bands.

FIG. 9 is an illustration of a system 200 for detecting two infrared bands. The system 200 includes a dual-band photodetector 214 (i.e., photodetector 14) wherein the substrate 216 being disposed on an optical window side of the first absorption layer (i.e., absorption layer 8, 8' or 20). The first absorption layer may be lattice matched to the substrate 216.

The system 200 further comprises a readout integrated circuit (ROIC) 240 having at least one multiplex output 245. The pixel bumps 226 being electrically coupled to the ROIC 240 wherein the ROIC applies the forward bias or the reverse bias. For example, when a reverse bias is applied by the ROIC 240, any photon that is absorbed in the MWIR (or first) absorption layer has the capability to be collected and converted into a photocurrent. Alternately, when a forward bias is applied by the ROIC 240 any photon that is absorbed in the LWIR absorption layer 230 has the capability to be collected and converted into a photocurrent.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

We claim:

1. A photodetector, comprising:
    a first absorption layer of a bulk alloy having a predetermined doping type to absorb photons in a first infrared (IR) wavelength band of a first wavelength range;

a second absorption layer comprising a dilute nitride alloy having a predetermined doping type to absorb photons in a second IR wavelength band of a second wavelength range; and a barrier layer disposed between the first absorption layer and the second absorption layer, wherein:
the first and second IR wavelength bands are spectrally separated with the first wavelength range being lower than the second wavelength range;
the barrier layer and the second absorption layer have valence band energy aligned with the first absorption layer, and
at least one of the barrier layer and the second absorption layer is lattice matched to the first absorption layer.

2. The photodetector of claim 1, wherein:
the first range of wavelengths includes a first portion in a long-wavelength IR (LWIR) band; and
the second range of the wavelengths includes a second portion of the long-wavelength IR (LWIR) band wherein the first portion and the second portion are different.

3. The photodetector of claim 1, further comprising:
a substrate disposed on an optical window side of the first absorption layer, such that the first absorption layer is lattice matched to the substrate.

4. The photodetector of claim 1, further comprising
a buffer layer disposed between the first absorption layer and the substrate.

5. The photodetector of claim 1, further comprising a substrate and a buffer layer disposed between the first absorption layer and the substrate, such that the second absorption layer, the barrier layer, and the first absorption layer are lattice matched to the buffer layer.

6. The photodetector of claim 1, wherein the second absorption layer is subdivided into a plurality of contact regions to delineate pixels, each contact region having an active area and a passivated area; and
further comprising a ground coupled to the first absorption layer.

7. The photodetector of claim 6, wherein:
the first absorption layer has a chemical potential therein such that, when a reverse bias is applied to the photodetector via the plurality of contact regions and the ground, minority carriers from the first absorption layer are driven across the barrier layer such that the photodetector is responsive to photons in a spectral band of the first absorption layer; and
the second absorption layer has a chemical potential therein such that, when a forward bias is applied to the photodetector via the plurality of contact regions and the ground, minority carriers from the second absorption layer are driven across the barrier layer such that the photodetector is responsive to photons in a spectral band of the second absorption layer.

8. The photodetector of claim 1, wherein:
the first IR wavelength band comprises a medium-wavelength IR (MWIR) range; and
the second IR wavelength band comprises a long-wavelength IR (LWIR) range.

9. The photodetector of claim 8, wherein:
the first absorption layer comprises a MWIR absorption layer comprising an InAsSb alloy;
the barrier layer comprises an AlGaAsSb alloy; and
the second absorption layer comprises a LWIR absorption layer comprising an InNAsSb alloy wherein In is indium; As is arsenic; Sb is antimony; Al is aluminum, N is nitrogen and Ga is gallium.

10. A system, comprising:
a readout integrated circuit (ROIC); and
a dual-band photodetector configured to collect photons in a first infrared (IR) wavelength band when a first bias is applied to the photodetector and collect photons in a second infrared (IR) wavelength band when a second bias is applied to the photodetector, the photodetector, comprising:
a first absorption layer of a bulk alloy having a predetermined doping type to absorb photons in a first infrared (IR) wavelength band of a first wavelength range;
a second absorption layer comprising a dilute nitride alloy having a predetermined doping type to absorb photons in a second IR wavelength band of a second wavelength range; and
a barrier layer disposed between the first absorption layer and the second absorption layer,
wherein:
the first and second IR wavelength bands are spectrally separated with the first wavelength range being lower than the second wavelength range;
the barrier layer and the second absorption layer have valence band energy aligned with the first absorption layer; and
at least one of the barrier layer and the second absorption layer is lattice matched to the first absorption layer.

11. The system of claim 10, wherein:
the first range of wavelengths includes a first portion in a long-wavelength IR (LWIR) band; and
the second range of the wavelengths includes a second portion of the long-wavelength IR (LWIR) band wherein the first portion and the second portion are different.

12. The system of claim 10, further comprising:
a substrate disposed on an optical window side of the first absorption layer, such that the first absorption layer is lattice matched to the substrate.

13. The system of claim 10, further comprising a substrate and a buffer layer disposed between the first absorption layer and the substrate, such that the second absorption layer, the barrier layer, and the first absorption layer are lattice matched to the buffer layer.

14. A system of claim 10, wherein the second absorption layer is subdivided into a plurality of contact regions to delineate pixels, each contact region having an active area and a passivated area; and
further comprising a ground coupled to the first absorption layer.

15. The system of claim 14, wherein:
the first bias is a reverse bias and the second bias is a forward bias;
the first absorption layer has a chemical potential therein such that, when the reverse bias is applied to the photodetector via the plurality of contact regions and the ground, minority carriers from the first absorption layer are driven across the barrier layer such that the photodetector is responsive to photons in a spectral band of the first absorption layer; and
the second absorption layer has a chemical potential therein such that, when the forward bias is applied to the photodetector via the plurality of contact regions and the ground, minority carriers from the second absorption layer are driven across the barrier layer such that the photodetector is responsive to photons in a spectral band of the second absorption layer.

16. The system of claim 10, wherein:
the first IR wavelength band comprises a medium-wavelength IR (MWIR) range; and
the second IR wavelength band comprises a long-wavelength IR (LWIR) range.

17. The system of claim 16, wherein:
the first absorption layer comprises a MWIR absorption layer comprising an InAsSb alloy;
the barrier layer comprises an AlGaAsSb alloy; and
the second absorption layer comprises a LWIR absorption layer comprising an InNAsSb alloy wherein In is indium; As is arsenic; Sb is antimony; Al is aluminum, N is nitrogen and Ga is gallium.

18. A method, comprising:
forming, for a photodetector, a first absorption layer of a bulk alloy having a predetermined doping type to absorb photons in a first infrared (IR) wavelength band of a first wavelength range;
forming, for the photodetector, a second absorption layer comprising a dilute nitride alloy having a predetermined doping type to absorb photons in a second IR wavelength band of a second wavelength range; and
forming, for the photodetector, a barrier layer disposed between the first absorption layer and the second absorption layer,
wherein:
the first and second IR wavelength bands are spectrally separated with the first wavelength range being lower than the second wavelength range;
the barrier layer and the second absorption layer have valence band energy aligned with the first absorption layer, and
at least one of the barrier layer and the second absorption layer is lattice matched to the first absorption layer.

19. The method of claim 18, further comprising forming a substrate, for the photodetector, having a certain lattice constant wherein:
the forming of the first absorption layer includes selecting a first absorbing material having a desired first band cut-off wavelength and which is lattice matched to the substrate; and depositing the first absorbing material onto a surface of the substrate to form the first absorption layer;
the forming of the barrier layer includes selecting a barrier material that is lattice matched to the substrate and is valence-band aligned to the first absorption layer; and depositing the barrier material onto a surface of the first absorption layer to form the barrier layer of sufficient thickness to prevent tunneling; and
the forming of the second absorption layer includes selecting a second absorbing material by adding dilute nitride to the first absorbing material to adjust the band gap of a resulting dilute alloy to a desired second band cut-off wavelength while maintaining valence-band alignment with the barrier layer; and depositing the second absorbing material onto a surface of the barrier layer to form the second absorption layer.

20. The method of claim 19, wherein: the depositing of the first absorbing material, the barrier and/or the second absorbing material includes one of a liquid phase epitaxy deposition technique and the molecular beam epitaxy deposition technique.

21. The method of claim 18, wherein:
the first IR wavelength band comprises one of a medium-wavelength IR (MWIR) range or a long-wavelength IR (LWIR) range; and
the second IR wavelength band comprises a long-wavelength IR (LWIR) range.

* * * * *